000

United States Patent
Fujimoto et al.

(10) Patent No.: US 7,391,457 B2
(45) Date of Patent: Jun. 24, 2008

(54) IMAGE SENSOR MODULE WITH LIGHT-SHIELDING DIAPHRAGM MADE OF INK, AND METHOD OF MAKING THE SAME

(75) Inventors: Hisayoshi Fujimoto, Kyoto (JP); Hiroaki Onishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 467 days.

(21) Appl. No.: 10/128,250

(22) Filed: Apr. 24, 2002

(65) Prior Publication Data
US 2002/0154239 A1 Oct. 24, 2002

(30) Foreign Application Priority Data
Apr. 24, 2001 (JP) .............................. 2001-126101

(51) Int. Cl.
H04N 5/225 (2006.01)
G02B 9/00 (2006.01)
G02B 9/08 (2006.01)

(52) U.S. Cl. ...................... 348/340; 348/342; 359/738; 359/740

(58) Field of Classification Search ............... 348/340, 348/335, 373–375; 359/819, 601, 738, 894, 359/740; 257/431–435; 382/104; 438/51
See application file for complete search history.

(56) References Cited

U.S. PATENT DOCUMENTS 4,240,701 A * 12/1980 Lytle .......................... 359/715
5,673,083 A * 9/1997 Izumi et al. ................. 348/340
6,075,237 A * 6/2000 Ciccarelli ................. 250/208.1
6,359,740 B1 * 3/2002 Tsuchiya ..................... 359/819
6,483,652 B2 * 11/2002 Nakamura .................. 359/819
6,594,204 B1 * 7/2003 Yamamoto et al. ....... 369/44.14
6,611,610 B1 * 8/2003 Stam et al. .................. 382/104
6,762,796 B1 * 7/2004 Nakajoh et al. ............ 348/340
7,046,296 B2 * 5/2006 Shinomiya .................. 348/374
2001/0007475 A1 * 7/2001 Mogamiya .................. 348/374
2001/0055073 A1 * 12/2001 Shinomiya .................. 348/374
2002/0131782 A1 * 9/2002 Yamaguchi et al. ........ 396/429
2003/0128442 A1 * 7/2003 Tanaka et al. .............. 359/819

FOREIGN PATENT DOCUMENTS

JP         10-041492       2/1998

OTHER PUBLICATIONS

English Language Abstract of JP-A-10-041492.

* cited by examiner

Primary Examiner—Lin Ye
Assistant Examiner—Kelly L Jerabek
(74) Attorney, Agent, or Firm—Michael Bednarek; Paul, Hastings, Janofsky & Walker LLP

(57) ABSTRACT

An image sensor module includes a lens member, a resin frame that holds the lens member, a diaphragm formed on the lens member, an image sensor chip that receives light converged by the lens member, and a supporting board upon which the image sensor chip is mounted. The board is fixed to the bottom side of the resin frame. The diaphragm includes an opening for allowing the passage of light, and a light-shielding portion which is entirely held in contact with the lens member. The lens member is glued to the frame so that any additional fixing element such as a lens cap is unnecessary.

12 Claims, 8 Drawing Sheets

IMAGE SENSOR MODULE WITH LIGHT-SHIELDING DIAPHRAGM MADE OF INK, AND METHOD OF MAKING THE SAME

BACKGROUND OF THE INVENTION

1. Field of the Invention

The present invention relates to an image sensor module incorporated in a device having an image capturing function, such as a digital camera, mobile phone or camera-integrated watch. The present invention also relates to a method of making such an image sensor module.

2. Description of the Related Art

Conventionally, an image capturing device such as a digital camera incorporates an image sensor module for converting optical image data of an object into electric signals. An example of prior art image sensor module is illustrated in FIG. 8. In the prior art image sensor module 200 shown in the figure, an image sensor chip 1 and internal terminals Ta electrically connected to the image sensor chip 1 are enclosed in a package 209. The image sensor chip 1 is formed, at the upper surface thereof, with a light receiving portion 11. When the light receiving portion 11 receives light, image signals with output levels corresponding to the received amount of light are generated by photoelectric conversion elements and outputted from electrode pads. The package 209, which protects the image sensor chip 1, is formed with an opening which is closed with a cover glass 291. Each of the internal terminals Ta is connected to a corresponding external terminal Tb projecting outward of the package 209, thereby providing a connection terminal T'.

As shown in FIG. 9, the image sensor module 200 is used in combination with a lens 103 for converging light reflected by an object onto the image receiving portion 11. Specifically, for using the image sensor module 200, a lens mount 204 for supporting the lens 103 is prepared. As shown in the figure, the lens mount 204 is so disposed as to cover the image sensor module 200.

In the above prior art, a lens mount 204 need be separately prepared from the image sensor module 200. Therefore, the number of parts and the process steps for the manufacturing are increased as a whole, which results in a high manufacturing cost. Further, since the lens mount 204 need be larger than the image sensor module 200, the entire size is inevitably increased.

FIG. 10 illustrates another prior art image sensor module disclosed in JP-A-10-41492. As shown in the figure, the image sensor module 100 includes an image sensor chip 1 and a lens 103 which are supported by a frame 104.

The image sensor chip 1 is mounted on an upper surface of a substrate 2. The substrate 2 has a lower surface formed with connection terminals T, which are electrically connected to the image sensor chip 1. The frame 104 includes a chip case portion 104a for covering the image sensor chip 1 and a lens mount portion 104b located above the chip case portion 104a. The frame 104 is formed of a resin so that the chip case portion 104a and the lens mount portion 104b are integral with each other to provide a generally cylindrical configuration as a whole. The chip case portion 104a has a flat lower end surface to which the substrate 2 is attached.

The lens mount portion 104b is internally formed with a stepped portion 140 upon which the lens 103 is placed. Thus, the inner space of the frame 104 is sealed by the substrate 1 and the lens 103. Use is made of a lens cap 108 for holding the lens 103 in place relative to the stepped portion 140 so that the lens 103 does not come out of the lens mount portion 104b. More specifically, the lens cap 108 is fitted outwardly to the lens mount portion 104b from above, so that the peripheral portion of the lens 103 is sandwiched between a thick wall portion 108a of the lens cap 108 and the stepped portion 140. At this time, the lens 103 and the image sensor chip 1 are so arranged that the optical axis of the lens 103 is perpendicular to the light receiving portion 11. Further, the distance between the lens 103 and the image sensor chip 1 is so set that parallel light entering the lens portion 103 forms a proper image on the light receiving portion 11.

An image sensor module often includes a diaphragm for increasing the depth of field so that the precise focusing is unnecessary. In this image sensor module 100, the lens cap 108 is formed with an aperture 107 as a diaphragm.

Unlike the image sensor module 200, the image sensor module 100 incorporates the lens 103, so that any external lens or lens support is not necessary. Further, since the lens 103 is fixed to the frame 104 just by fitting the lens cap 108 to the frame 104, the module can be assembled at a relatively low cost. Moreover, unlike the image sensor module 200, the image sensor chip 1 is used as it is (i.e., without being packaged). Therefore, the image sensor module 100 can be made smaller in entire area surface than the image sensor module 200.

However, since the image sensor module 100 utilizes the lens cap 108, the overall cost of the structural parts will be high accordingly.

Further, recently, there is a demand for thickness reduction of an image sensor module for incorporation in a thin device such as a mobile phone or a watch for example. However, due to the additional thickness of the lens cap 108, the image sensor module 100 is not a suitable unit to provide a device that should be compact.

SUMMARY OF THE INVENTION

It is, therefore, an object of the present invention to provide an image sensor module which is relatively small in overall size and which can be manufactured at a relatively low cost. Another object of the present invention is to provide a method for making such an image sensor module.

According to a first aspect of the present invention, there is provided an image sensor module that includes: a lens member including a first surface and a second surface opposite to the first surface; a frame that holds the lens member; a diaphragm formed on the first surface of the lens member, the diaphragm including an opening and a light-shielding portion; an image sensor chip that receives light converged by the lens member; and a board upon which the image sensor chip is mounted, and which is fixed to the frame. The light-shielding portion of the diaphragm is entirely held in contact with the lens member.

Preferably, the first surface of the lens member may be provided with a retreated portion corresponding in position to the opening of the diaphragm.

Preferably, the frame may be internally provided with a lens holding space that accommodates the lens member in a manner such that the lens member avoids protruding from the frame.

Preferably, the inner diameter of the lens holding space may be smaller than the outer diameter of the lens member, so that the lens member is press-fitted into the lens holding space.

Preferably, the second surface of the lens member may be provided with a convex light-emitting portion.

Preferably, the lens member may include a cylindrical wall surrounding the convex light-emitting portion.

Preferably, the cylindrical wall may include a flat reference contact surface for positioning the lens member relative to the frame, wherein the convex light-emitting portion avoids protruding beyond the reference contact surface.

Preferably, the reference contact surface may be perpendicular to an optical axis of the lens member.

Preferably, the module of the present invention may further include a bonding layer for fixing the lens member to the frame.

Preferably, the lens member may be fixed to the frame by ultrasonic bonding.

Preferably, the module of the present invention may further include an optical filter disposed between the lens member and the image sensor chip.

Preferably, the frame may be internally provided with a chip accommodating space that accommodates the image sensor chip. The chip accommodating space may be hermetically closed by the board and the optical filter.

Preferably, the diaphragm may be made of light-shielding ink.

According to a second aspect of the present invention, there is provided a method of making an image sensor module. This method includes the steps of: mounting an image sensor chip onto a supporting board; forming an intermediate assembly by fixing the board to a lens holding frame; fixing the intermediate assembly to an external element by reflow soldering; and fixing a lens member to the lens holding frame.

Preferably, the fixing of the lens member may be performed by using a glue, or by press-fitting the lens member into the lens holding frame, or by ultrasonic bonding.

Other features and advantages of the present invention will become clearer from the detailed description given below with reference to the accompanying drawings.

DETAILED DESCRIPTION OF THE PREFERRED EMBODIMENT

Figure 7:
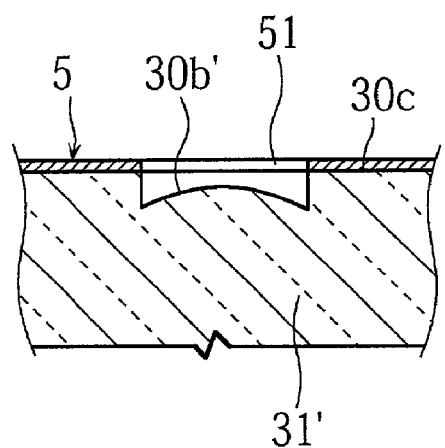
FIG. 7 is a schematic sectional view showing another example of lens member according to the present invention.
Figure 8:
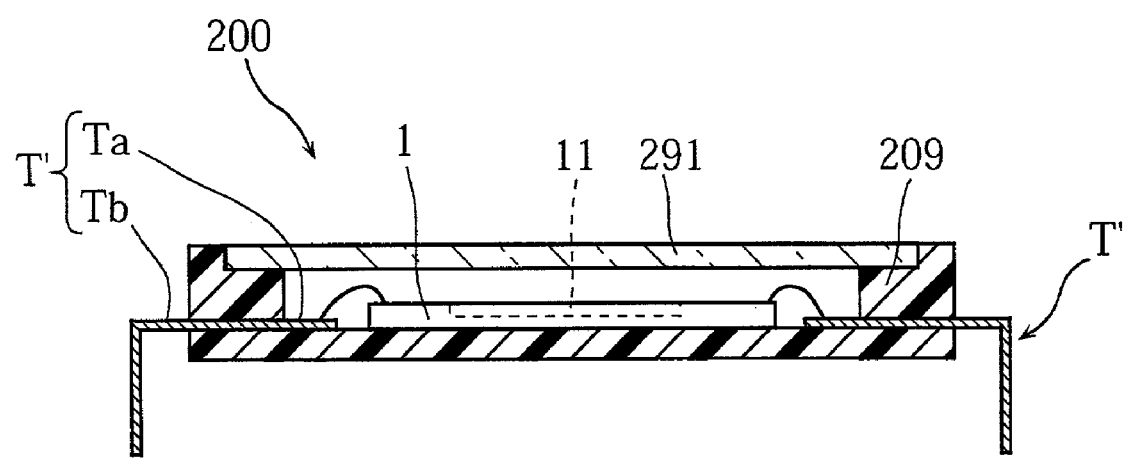
FIG. 8 is a schematic sectional view illustrating an example of prior art image sensor module.
Figure 9:
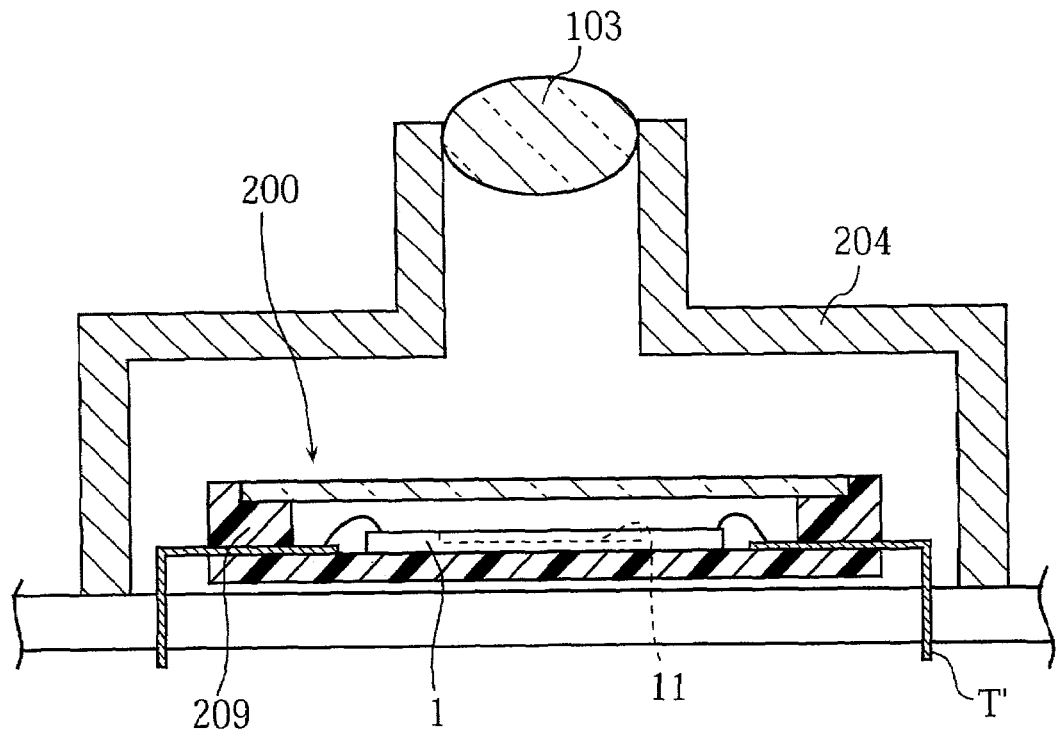
FIG. 9 is a schematic sectional view illustrating the image sensor module of FIG. 8 in use.
Figure 10:
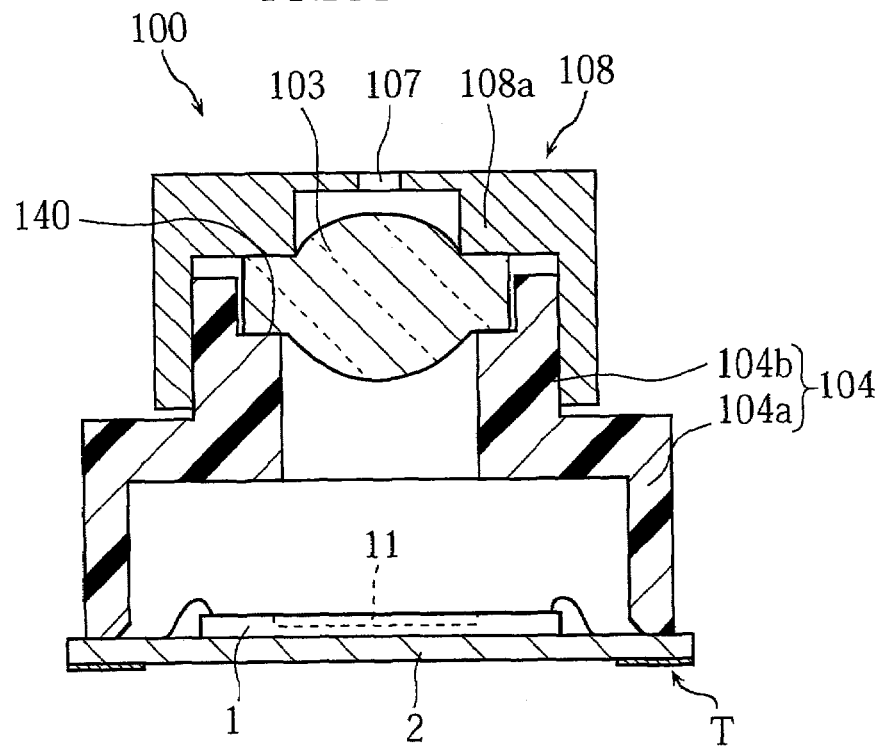
FIG. 10 is a schematic sectional view illustrating another example of prior art image sensor module.

Preferred embodiments of the present invention will be described below in detail with reference to the FIGS. 1-7 and 9. In these figures, the elements or portions which are identical or similar to those of the prior art image sensor module shown in FIGS. 8 and 10 are designated by the same reference signs as those used for the prior art module.

Figure 1:
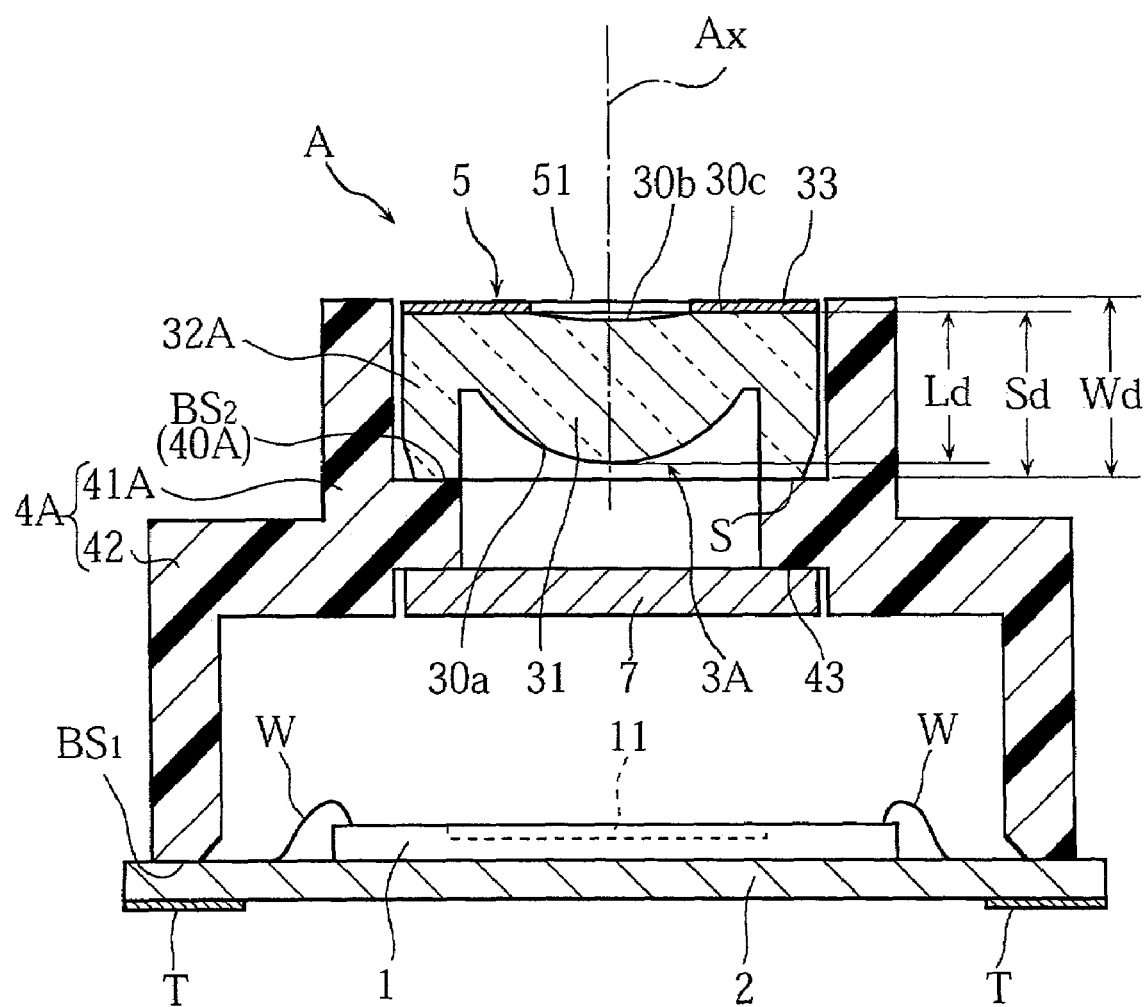
FIG. 1 is a schematic sectional view illustrating an image sensor module embodying the present invention.
Figure 2:
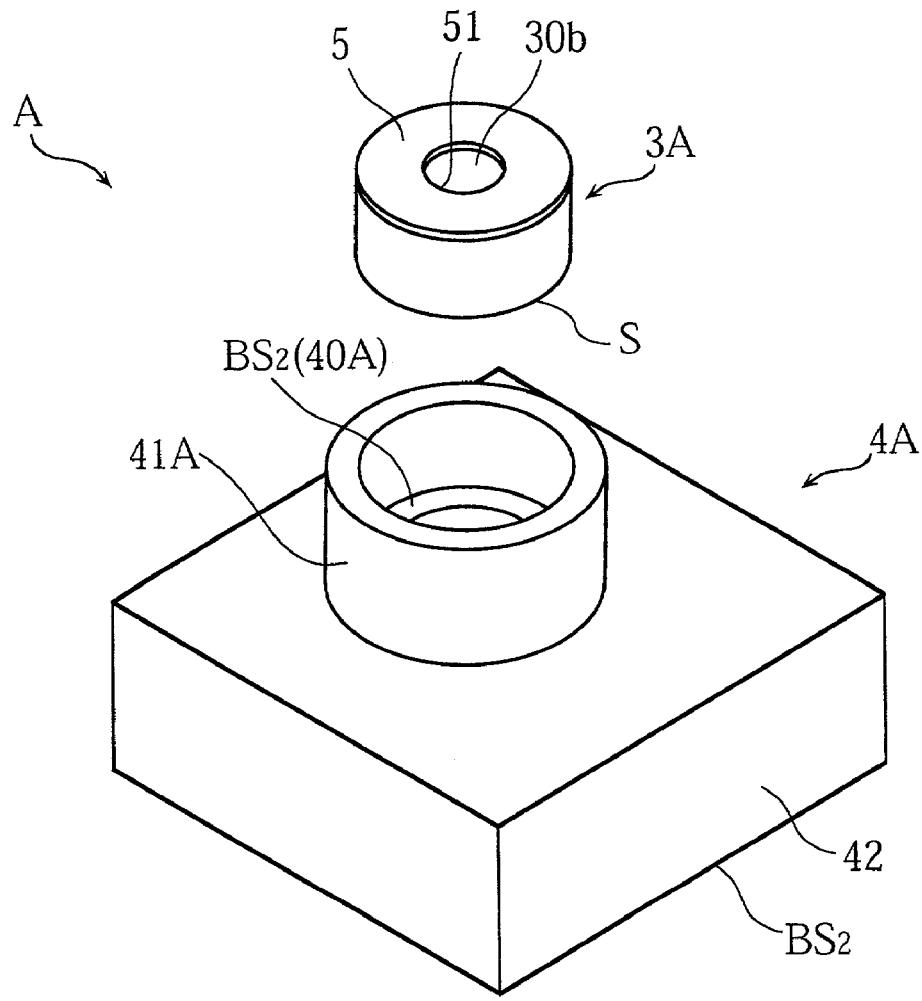
FIG. 2 is an exploded view of the image sensor module of FIG. 1.

As shown in FIGS. 1 and 2, an image sensor module A according to the present invention includes a substrate 2 on which an image sensor chip 1 is mounted, a lens member 3A, and a resin frame 4A for accommodating the image sensor chip 1 and the lens member 3A.

The image sensor chip 1 may be a solid state image sensor of a CCD type or a MOS type for example, and has a flat and rectangular configuration, as seen from FIG. 2. The image sensor chip 1 is provided with a light receiving portion 11 under which a plurality of photoelectric conversion elements (not shown) are arranged in a matrix. Further, a plurality of electrode pads 12 are formed on the upper surface of the image sensor chip. Upon receiving light at the light receiving portion 11, each of the photoelectric conversion elements generates an electric signal with a level corresponding to the received amount of light and outputs the signal from a corresponding one of the electrode pads 12.

As shown in FIG. 2, the substrate 2, which may be a flat rectangular printed circuit board, is large enough to close the lower opening of a chip case portion 42. The substrate 2 has an obverse surface formed with a wiring pattern (not shown) provided with a plurality of conductor pads 21. Each of the conductor pads 21 is connected to a corresponding one of the electrode pads 12 of the image sensor chip 1 via a wire W. The substrate 2 has a reverse surface provided with a plurality of electrode terminals T for surface-mounting the image sensor module A to an external device. The electrode terminals T are electrically connected to the wiring pattern on the obverse surface of the substrate 2 via non-illustrated through holes.

As shown in FIG. 1, the lens member 3A includes an effective lens portion 31 for converging the light reflected by an object, and a support portion 32A surrounding the lens portion 31. The lens portion 31 and the support portion 32A are formed of a light-permeable material such as acryl or PMMA (polymethyl methacrylate) and integral with each other.

The lens portion 31 has a downwardly convex lower surface 30a for facing the image sensor chip 1. The lens portion 31 has an upper surface which consists of a central concave region 30b and a flat region 30c surrounding the concave region 30b.

The support portion 32A includes, at the lower end thereof, a flat support surface S perpendicular to the optical axis Ax of the lens portion 31. The support surface S, in other words, is parallel to a reference plane (not shown) of the lens portion 31, wherein the "reference plane" is perpendicular to the axis Ax.

Further, the support portion 32A has a flat upper surface 33 connected to the flat region 30c of the lens portion 31. The support portion 32A is cylindrical to surround the lens portion 31. The lower end of the support portion 32A serves as the support surface S. The thickness Sd of the support portion 32A is larger than the thickness Ld of the lens portion 31 so that the convex lower surface 30a of the lens portion 31 does not project downward beyond the support surface S. With this structure, the flattening process of the support surface S can be performed without damaging the lens portion 31.

As shown in FIG. 2, the flat region 30c of the upper surface of the lens member 3A is covered with a light shielding layer 5, so that light is prevented from passing through portions other than the concave region 30b. Specifically, the light shielding layer 5 includes a circular aperture 51 at a portion corresponding to the concave region 30b, thereby serving as a diaphragm. The aperture 51 is relatively small in diameter to increase the depth of field. Thus, the image sensor module A or a device incorporating the module need not include any focusing mechanism, which is advantageous to reducing the size of the module or the device. The diameter of the aperture 51 is set to the smallest value so long as it allows light of the amount necessary for capturing images to reach the image sensor chip 1.

The light shielding layer 5 may be formed by printing a light-resistant coating material (e.g. black coating) on the upper surface of the lens member 3A. For this printing, use may be made of a printing roller carrying such a coating material. Simply by running the roller over the lens member 3A, the aperture 51 is readily made due to the concave region 30b with which the roller does not come into contact.

The resin frame 4A is made of a light shielding resin such as a black epoxy resin. As shown in FIG. 2, the resin frame 4A includes a chip case portion 42 and a lens mount portion 41A disposed above the chip case portion 42. As shown in FIG. 1, the chip case portion 42 and the lens mount portion 41A are integral with each other so that the respective inner spaces communicate with each other.

As shown in FIG. 2, the chip case portion 42 is shaped like a box having an upper opening and a lower opening. The lens mount portion 41A is generally cylindrical to receive the lens member 3A. As shown in FIG. 1, the chip case portion 42 has a flat substrate base surface $BS_1$ coming into contact with the substrate 2, whereas the lens mount portion 41A has a flat lens base surface $BS_2$ for supporting the lens member 3A.

As shown in FIG. 2, the lens mount portion 41A is formed with a stepped portion 40A projecting radially inward from the inner wall surface of the lens mount portion 41A. The stepped portion 40A has an upper surface serving as the lens base surface $BS_2$. With this structure, when the substrate 2 and the lens member 31 are assembled with the resin frame 4A as shown in FIG. 1, the resin frame 4A is closed by the substrate 2 and the lens member 3A.

As shown in FIG. 1, the thickness Sd of the support portion 32A is smaller than a depth Wd measured between the top of the lens mount portion 41A and the stepped portion 40A. Thus, the lens member 3A does not protrude upward beyond the top of the lens mount portion 41A.

The substrate base surface $BS_1$ and the lens base surface $BS_2$ are parallel to each other. Thus, when the substrate 2 and the lens member 31 are mounted to the resin frame 4A, the non-illustrated reference plane of the lens portion 31 is parallel to the light receiving portion 11 of the image sensor chip 1. Further, the distance between the substrate base surface $BS_1$ and the lens base surface $BS_2$ is so set that parallel light entering the lens portion 31 forms a proper image on the light receiving portion 11.

The image sensor module A is assembled as follows. The substrate 2 is attached to the chip case portion 42 of the resin frame 4A by bringing the upper surface of the substrate 2 into contact with the substrate base surface $BS_1$. The substrate 2 is fixed to the resin frame 4A with an adhesive for example. In mounting the lens member 3A to the lens mount portion 41A of the resin frame 4A, the lens member 3A is properly positioned relative to the image sensor chip 1 just by bringing the support surface S of the lens member 3A into contact with the lens base surface $BS_2$.

Figure 3:
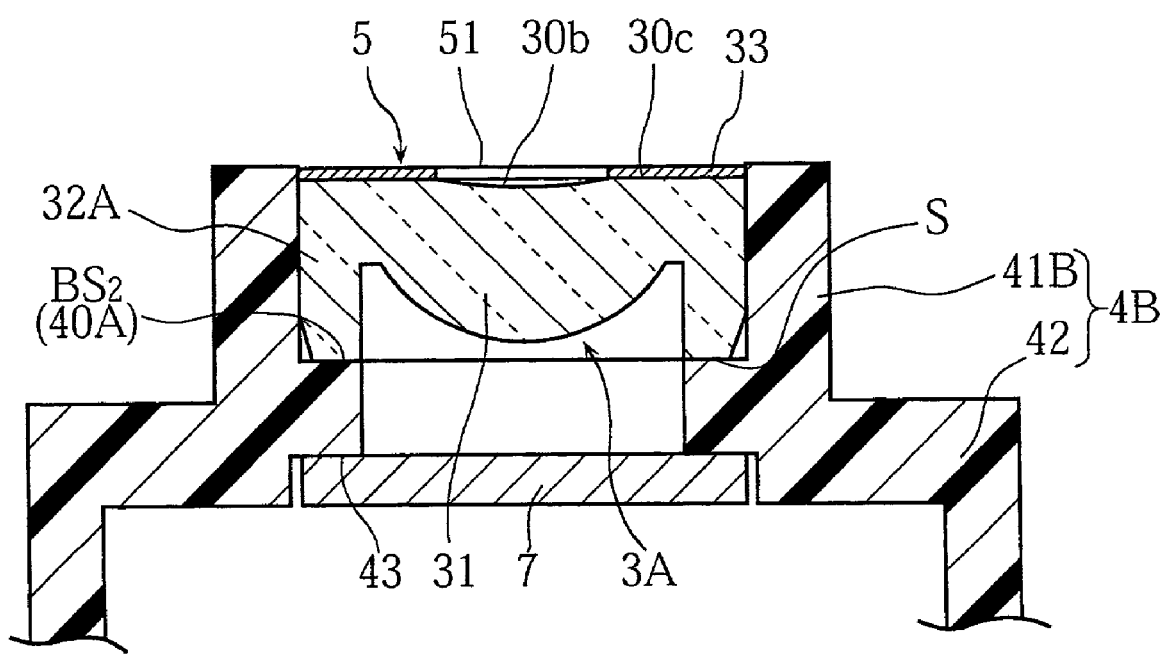
FIG. 3 is a schematic sectional view illustrating a lens member and a resin package of an image sensor module according to another embodiment of the present invention.

In the above embodiment, the lens member 3A is bonded to the lens mount portion 41A with an adhesive. According to the present invention, as shown in FIG. 3, the lens member 3A may simply be fitted into the lens mount portion 41B. For this purpose, the inner diameter of the lens mount portion 41B is slightly smaller than the outer diameter of the lens member 3A. With this structure, when the lens member 3A is inserted into the lens mount portion 41B, the lens mount portion 41B elastically presses the outer circumferential surface of the lens member 3A, thereby fixing the lens member 3A. Since the support portion 32A of the lens member 3A is generally cylindrical, a relatively large contact area is provided between the lens member 3A and the lens mount portion 41B. Therefore, the lens member 3A can be reliably secured to the resin frame 4B.

Figure 4A:
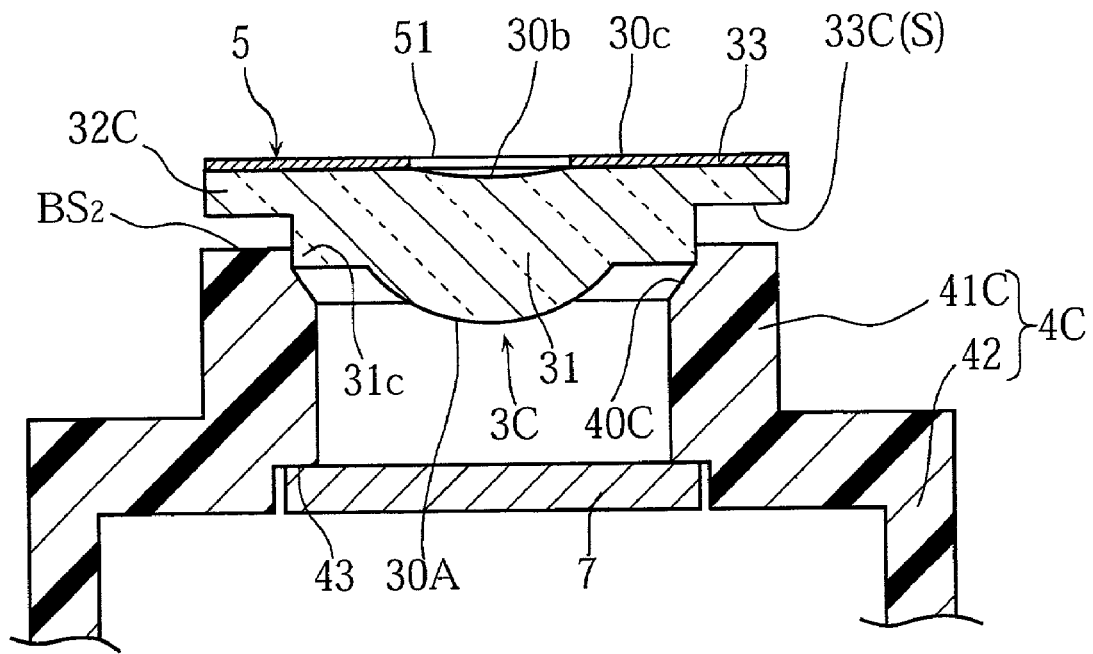
FIGS. 4A and 4B are schematic sectional views illustrating process steps for fixing a lens member to a resin package according to another embodiment of the present invention.
Figure 4B:
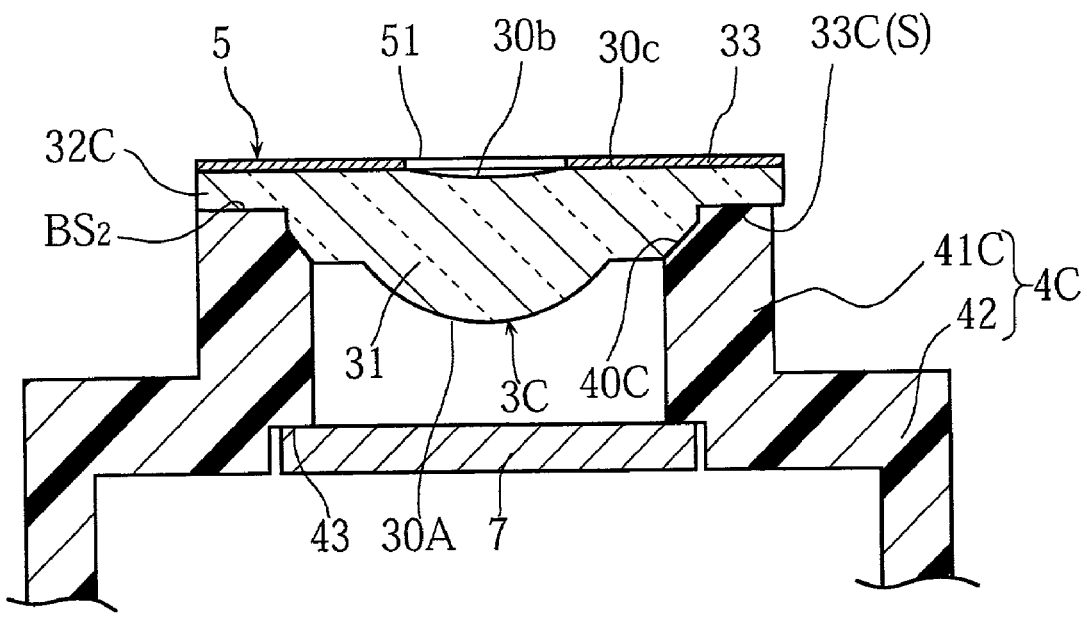

FIGS. 4A and 4B illustrate another embodiment of the present invention, in which a lens member 3C is fixed to a lens mount 41C of a resin frame 4C by ultrasonic bonding. Specifically, as shown in FIG. 4A, the lens member 3c has a support portion 32C which includes a thin peripheral portion. The thin peripheral portion has a flat lower surface serving as a support surface S. Unlike the lens mount portion 41A or 41B of the foregoing embodiments, the lens mount portion 41C is not formed with a stepped portion 40A. Instead, the lens mount portion 41C has an inner circumferential surface including a bonding surface 40C. The lens mount portion 41C has an upper end surface serving as the lens base surface $BS_2$. For fixing the lens member 3C to the resin frame 4C, the lens member 3C is pressed against the lens mount portion 41C while vibrating the lens member 3C by application of ultrasonic waves. As a result, a lower corner portion 31c of the lens member 3C is melted due to the friction with the bonding surface 40C. As the corner portion gradually deforms to fit to the bonding surface 40C, the support surface S gradually approaches the lens support surface $BS_2$ of the resin frame 4C and finally comes into complete contact with the surface $BS_2$, as shown in FIG. 4B. Then, the melted corner portion 31c is cooled for hardening, so that the lens member 3C is fixed to the resin frame 4C.

Figure 5A:
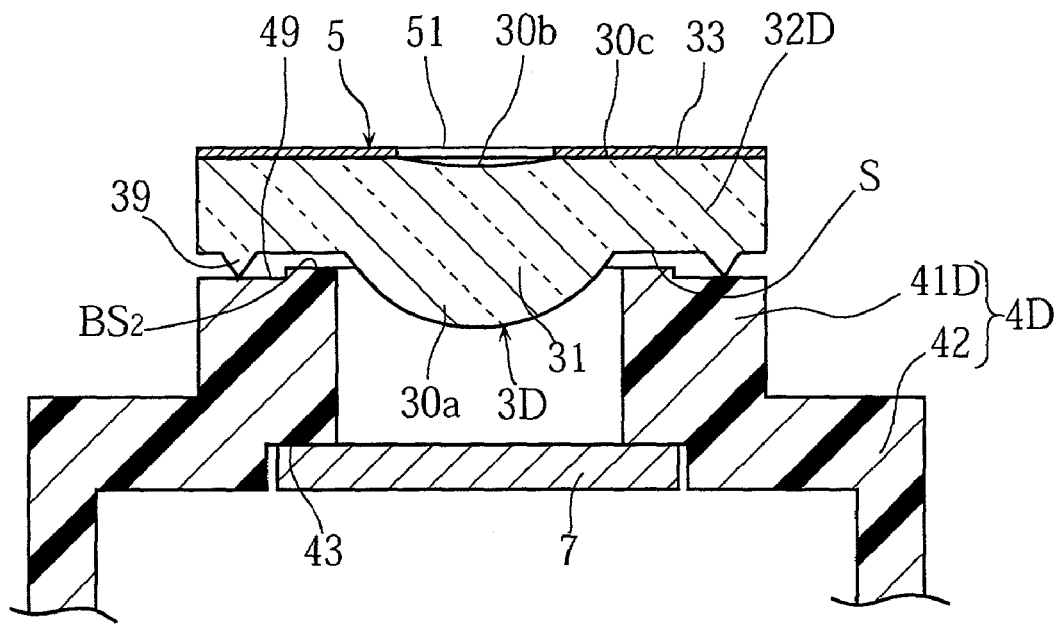
FIGS. 5A and 5B are schematic sectional views illustrating process steps for fixing a lens member to a resin package according to another embodiment of the present invention.
Figure 5B:
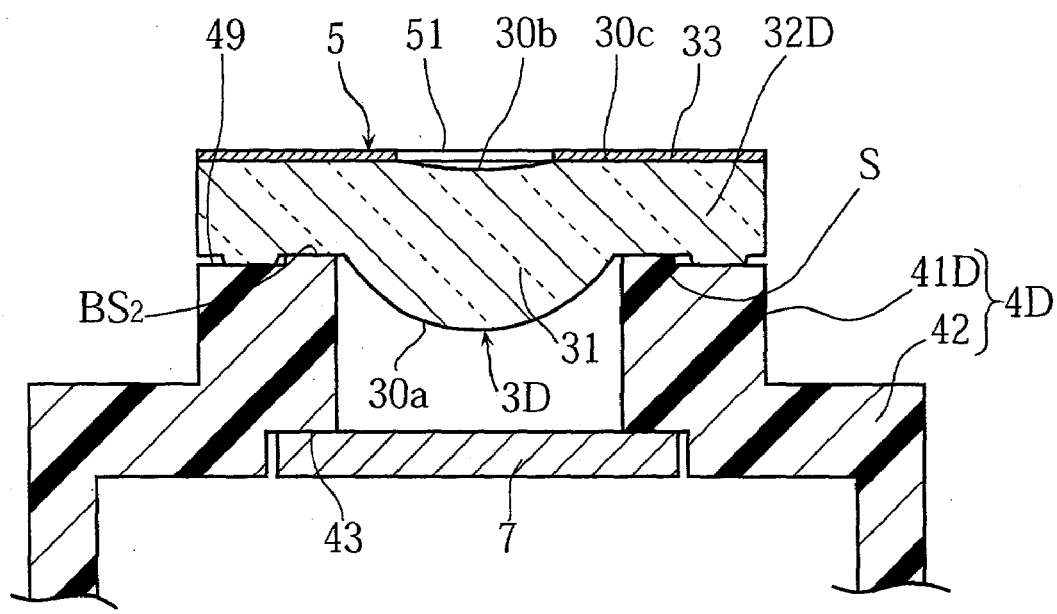

For performing the ultrasonic bonding, a lens member 3D and a resin frame 4D as shown in FIGS. 5A and 5B may also be utilized. Specifically, the lens member 3D includes a support portion 32D of a constant thickness. The support portion 32D has a lower surface serving as a support surface S. The lower surface is formed with projections 39. The resin frame 4D includes a lens mount portion 41D having an upper surface formed with a circumferentially extending recess 49 at a location corresponding to the projections 39. Portions of the upper surface of the resin frame 4D other than the recess 49 serves as the lens base surface $BS_2$. For fixing the lens member 3D to the resin frame 4D, the lens member 3D is pressed against the lens mount portion 41D while applying ultrasonic vibration to the lens member 3D, so that the projections 39 melt due to the friction with the bottom surface of the recess 49. As a result, the support surface S of the lens member 4D finally contacts the lens base surface $BS_2$ of the resin frame 4D, as shown in FIG. 4B. Thereafter, the melted projections 39 are cooled for hardening, thereby fixing the lens member 3D to the resin frame 4D.

Referring back to FIG. 1, the image sensor module A is provided with an optical filter 7 disposed between the chip case portion 42 and the lens mount portion. The optical filter 7 is provided for forming an image with high quality. Specifically, when an infrared-shielding filter is utilized as the optical filter 7, the image sensor chip 1 receives light containing no or small amount of infrared component. Therefore, the contour and the color of the object are clearly represented in the formed image. Such a filter may also be provided in the other image sensor modules shown in FIGS. 3, 4A~4B and 5A~5B.

The resin frame 4A shown in FIG. 1 is provided with a stepped portion (or filter mount portion) 43 to which the optical filter 7 is attached. As a result, the upper opening and the lower opening of the chip case portion 42 are closed by the optical filter 7 and the substrate 2, respectively. Similarly, the resin frame 4B, 4C and 4D are provided with a filter mount portion 43 (see FIGS. 3-5). Alternatively, the flat lower end surface of the lens mount portion 41 may be utilized as it is for the filter mount portion.

Next, a method for making an image sensor module A shown in FIG. 1 will be described with reference to FIGS. 6A-6C.

Figure 6A:
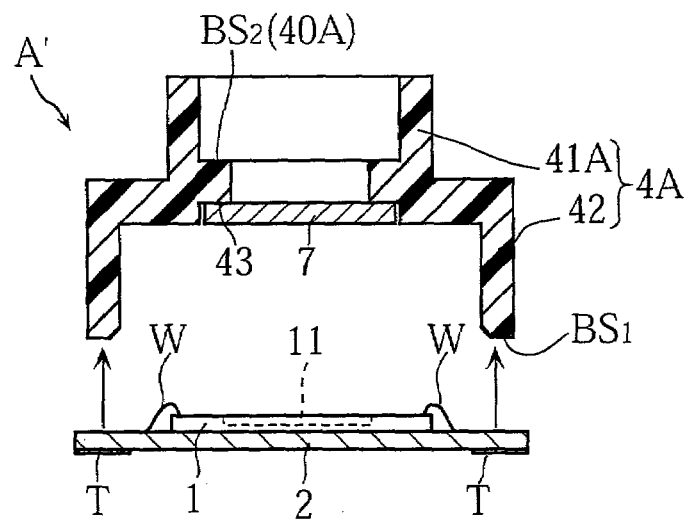
FIGS. 6A-6C are sectional views illustrating the process steps for making the image sensor module of FIG. 1.

As shown in FIG. 6A, an optical filter 7 is fixed to a filter mount portion 43 of a resin frame 4A with an adhesive for example. Meanwhile, an image sensor chip 1 is mounted on an obverse surface of a substrate 2, and the electrode pads of the image sensor chip 1 are connected to the conductor pads of the substrate 2 via wires W. The wire bonding may be performed using a capillary in a known manner. Since the substrate 2 is a flat board as described above, there are no objects for hindering the movement of the capillary so that the wire bonding can be easily performed. Subsequently, the substrate 2 carrying the image sensor chip 1 is fixed to the resin frame 4A, thereby providing an intermediate assembly A'. The positioning of the substrate 2 is performed by bringing the upper surface of the substrate 2 into contact with the base surface $BS_1$ of the chip case portion 42.

In the above manner, the chip case portion 42 is sealed by the substrate 2 and the optical filter 7. Therefore, in the subsequent process steps, it is possible to prevent dust or moisture from entering the chip case portion 42. Thus, even when the intermediate assembly A' is temporarily stored in a certain place or transported to another place as it is in the manufacturing process of the module A, the breakage of the image sensor chip 1 or the wires W due to dust or moisture can be prevented.

Figure 6B:
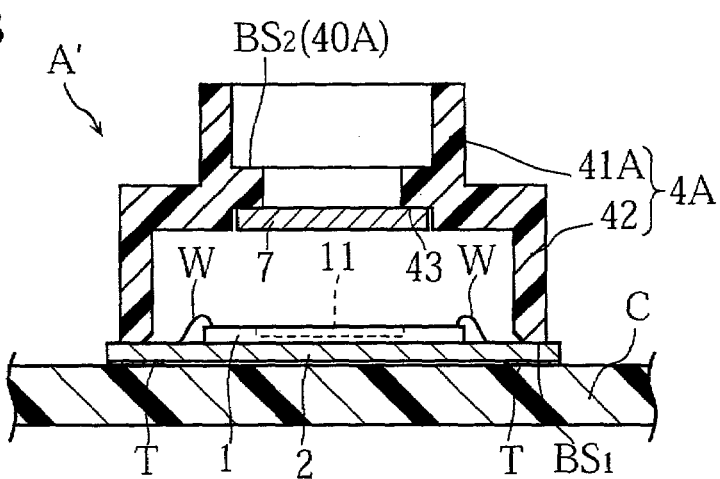

Then, as shown in FIG. 6B, the intermediate assembly A' is mounted to an external device C (e.g. a printed circuit board) by reflow soldering. Specifically, solder paste is applied to predetermined portions of the external device C. Then, the intermediate assembly A' is disposed on the external device C so that electrode terminals T on the reverse surface of the substrate 2 lie on the solder deposits on the external device C. Then, the solder deposits are melted by heating in a reflow oven and cooled for hardening. Thus, the intermediate assembly A' is fixed to the external device C.

Figure 6C:
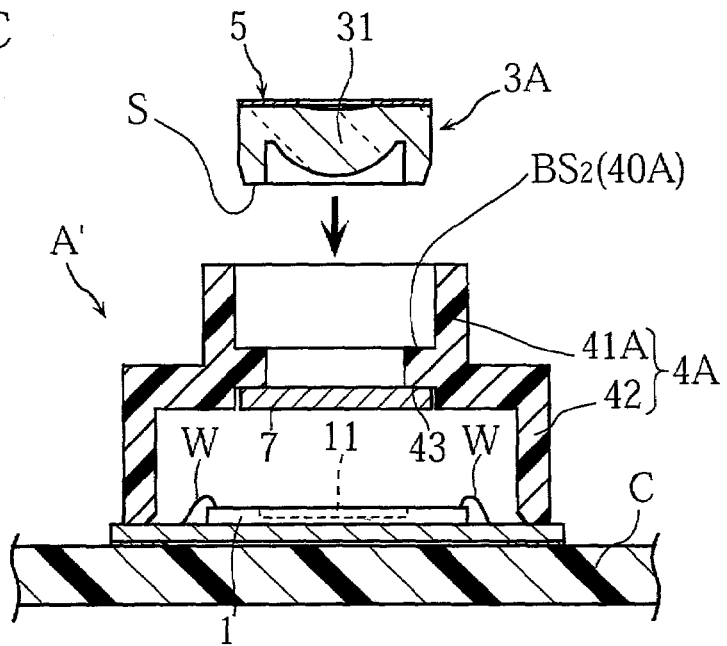

Then, as shown in FIG. 6C, a lens member 3A with a light shielding layer 5 formed thereon is attached to the resin frame 4A. As described before, the lens member 3A is accurately positioned by bringing the support surface S into contact with the lens base surface $BS_2$. The lens member 3A is glued to the lens mount portion 41A of the resin frame 4A.

In the step of reflow soldering, the temperature in the reflow oven is raised to about 220° C., which is higher than the melting point (170° C.) of the lens member 3A. However, since the lens member 3A is attached to the resin frame 4A after the reflow soldering is over, the lens member 3A is not adversely affected by the heating.

The image sensor module A having the above-described structure has the following advantages.

The image sensor module A has incorporated a lens member as an integral part. The positioning of the lens member 3A relative to the image sensor chip 1 is easily performed by bringing the lens member 3A, 3C or 3D into contact with the lens base surface $BS_2$ of a resin frame 4A. Therefore, unlike the prior art image sensor module 200 there is no need to prepare an additional lens, a lens support or the like in using the image sensor module A. Thus, otherwise troublesome work of positioning an external lens relative to the image sensor chip 1 can be eliminated. Thus, the number of parts required to fabricate the module is prevented from increasing and the manufacturing process of the module is not complicated.

Further, unlike the prior art image sensor module 200, the image sensor chip 1 is used as it is (i.e., without being packaged) Therefore, as compared with the prior art module 200, the image sensor module A can be made compact.

Moreover, unlike the prior art image sensor module 100 in which the lens is fixed using the lens cap 108, the lens member 3A is fixed to the resin frame 4A without using any fixing member. Therefore, the image sensor module A of the present invention can be made compact. Moreover, by the elimination of the lens cap 108, the number of structural parts can be reduced, resulting in a cost reduction.

In the embodiment described above, the lens portion 31 has an upper surface including a concave region 30b and a flat region 30c surrounding the concave region 30b. However, as shown in FIG. 7, a lens portion 31' may have an upper surface including a convex region 30b' and a flat region 30c surrounding the convex region 30b'. In this case, it is preferable that the flat region 30c is above the apex of the convex region 30b'.

The light shielding layer 5 may be formed by attaching a light shielding film to the lens member instead of applying and printing a coating material to the lens member.

The invention claimed is:

1. An image sensor module comprising:
    a lens member including a first surface and a second surface opposite to the first surface;
    a frame that holds the lens member, the frame including a loop-shaped top surface and a base surface opposite to the top surface, the frame being internally provided with a lens holding space for accommodating the lens member in a manner such that the lens member avoids protruding beyond the top surface of the frame;
    a diaphragm formed on the first surface of the lens member, the diaphragm including an opening and a light-shielding portion;
    an image sensor chip that receives light converged by the lens member; and
    a board upon which the image sensor chip is mounted, the board being fixed to the base surface of the frame;
    wherein the first surface of the lens member includes a flat torus portion and a concave portion surrounded by the torus portion, the concave portion corresponding in position to the opening of the diaphragm, the concave portion projecting toward the second surface of the lens member from the torus portion,
    wherein the diaphragm is made of light-shielding ink, the light-shielding portion of the diaphragm being entirely held in direct contact with the flat torus portion of the lens member, the diaphragm being substantially flush with the top surface of the frame.

2. The module according to claim 1, wherein an inner diameter of the lens holding space is smaller than an outer diameter of the lens member.

3. The module according to claim 1, wherein the second surface of the lens member is provided with a convex light-emitting portion.

4. The module according to claim 3, wherein the lens member includes a cylindrical wall surrounding the convex light-emitting portion.

5. The module according to claim 4, wherein the cylindrical wall includes a flat reference contact surface for positioning the lens member relative to the frame, and wherein the convex light-emitting portion avoids protruding beyond the reference contact surface.

6. The module according to claim 5, wherein the reference contact surface is perpendicular to an optical axis of the lens member.

7. The module according to claim 1, further comprising a bonding layer for fixing the lens member to the frame.

8. The module according to claim 1, further comprising an optical filter disposed between the lens member and the image sensor chip.

9. The module according to claim 8, wherein the frame is internally provided with a chip accommodating space that accommodates the image sensor chip, the chip accommodating space being hermetically closed by the board and the optical filter.

10. A method of making an image sensor module, the method comprising the steps of:
   mounting an image sensor chip onto a supporting board;
   preparing a lens holding frame including a loop-shaped top surface and a base surface opposite to the top surface, the frame being internally provided with a lens holding space;
   forming an intermediate assembly by fixing the board to the base surface of the lens holding frame;
   fixing the intermediate assembly to an external element by reflow soldering; and
   fixing a lens member to the lens holding frame in a manner such that the lens member is accommodated in the lens holding space without protruding beyond the top surface of the frame, the lens member including a first surface and a second surface opposite to the first surface;
   wherein the first surface of the lens member is formed with a diagram diaphragm including an opening and a light-shielding portion,
   wherein the first surface of the lens member includes a flat torus portion and a concave portion surrounded by the torus portion, the concave portion corresponding in position to the opening of the diaphragm, the concave portion projecting toward the second surface of the lens from the torus portion,
   wherein the diaphragm is made of light-shielding ink, the light-shielding portion of the diaphragm being entirely held in direct contact with the flat torus portion of the lens member, the diaphragm being substantially flush with the top surface of the frame.

11. The method according to claim 10, wherein the fixing of the lens member is performed by using a glue.

12. The method according to claim 10, wherein the fixing of the lens member is performed by press-fitting the lens member into the lens holding frame.

* * * * *